(12) United States Patent
Chang et al.

(10) Patent No.: US 10,310,549 B1
(45) Date of Patent: Jun. 4, 2019

(54) CLOCK SIGNAL GENERATING CIRCUIT AND OPERATING METHOD THEREOF

(71) Applicant: NANYA TECHNOLOGY CORPORATION, New Taipei (TW)

(72) Inventors: Chuan-Jen Chang, Hsinchu County (TW); Wen-Ming Lee, Miaoli County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 14 days.

(21) Appl. No.: 16/013,965

(22) Filed: Jun. 21, 2018

(51) Int. Cl.
*G06F 1/08* (2006.01)
*H03K 5/00* (2006.01)

(52) U.S. Cl.
CPC ........... *G06F 1/08* (2013.01); *H03K 5/00006* (2013.01)

(58) Field of Classification Search
None
See application file for complete search history.

(56) References Cited

U.S. PATENT DOCUMENTS

| | | | | |
|---|---|---|---|---|
| 5,864,572 A * | 1/1999 | Bhagwan | ............ | G06F 1/04 714/798 |
| 6,075,415 A * | 6/2000 | Milton | ............ | H03L 7/0995 327/116 |
| 6,700,421 B1 * | 3/2004 | Mirov | ............ | G06F 1/08 327/159 |
| 7,391,243 B2 * | 6/2008 | Choi | ............ | G06F 1/04 327/156 |
| 7,728,637 B2 * | 6/2010 | Choi | ............ | G06F 1/04 327/156 |
| 10,082,823 B1 * | 9/2018 | Chang | ............ | G06F 1/10 |
| 2015/0091622 A1 * | 4/2015 | Dastidar | ............ | H03L 1/022 327/143 |
| 2016/0172017 A1 * | 6/2016 | King | ............ | G11C 7/22 365/189.07 |

* cited by examiner

*Primary Examiner* — Cassandra F Cox
(74) *Attorney, Agent, or Firm* — CKC & Partners Co., LLC

(57) ABSTRACT

An operating method of a clock signal generating circuit includes the following operations: transmitting a clock signal to a clock tree circuit by a voltage detector; and adjusting a frequency of the clock signal according to a voltage of the clock tree circuit so as to maintain the voltage within a voltage range.

10 Claims, 3 Drawing Sheets

CLOCK SIGNAL GENERATING CIRCUIT AND OPERATING METHOD THEREOF

BACKGROUND

Technical Field

The present disclosure relates to clock signal generating circuit technology. More particularly, the present disclosure relates to a clock signal generating circuit and an operating method thereof for a delay-locked loop (DLL) clock signal generating circuit.

Description of Related Art

When an operating frequency of a clock signal generating circuit (for example, a DRAM) is getting higher, the data output time (tAC) would become unstable. Stabling the voltage of the clock tree is a commonly used method to stable the data output time. Therefore, how to stable the voltage of the clock tree is a problem to be addressed in the art.

SUMMARY

An aspect of the present disclosure is to provide an operating method of a clock signal generating circuit includes the following operations: transmitting a clock signal to a clock tree circuit by a voltage detector; and adjusting a frequency of the clock signal according to a voltage of the clock tree circuit so as to maintain the voltage within a voltage range.

Another aspect of the present disclosure is to provide a clock signal generating circuit. The clock signal generating circuit includes a clock tree circuit and a voltage detector. The voltage detector is coupled to the clock tree circuit. The voltage detector is configured to transmit a clock signal to the clock tree circuit. The voltage detector adjusts a frequency of the clock signal according to a voltage of the clock tree circuit so as to maintain the voltage within a voltage range.

In sum, the embodiments of the present disclosure provide a clock signal generating circuit and an operating method thereof, so as to stable the operating voltage of the clock tree circuit, and the data output time (tAC) would become stable.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
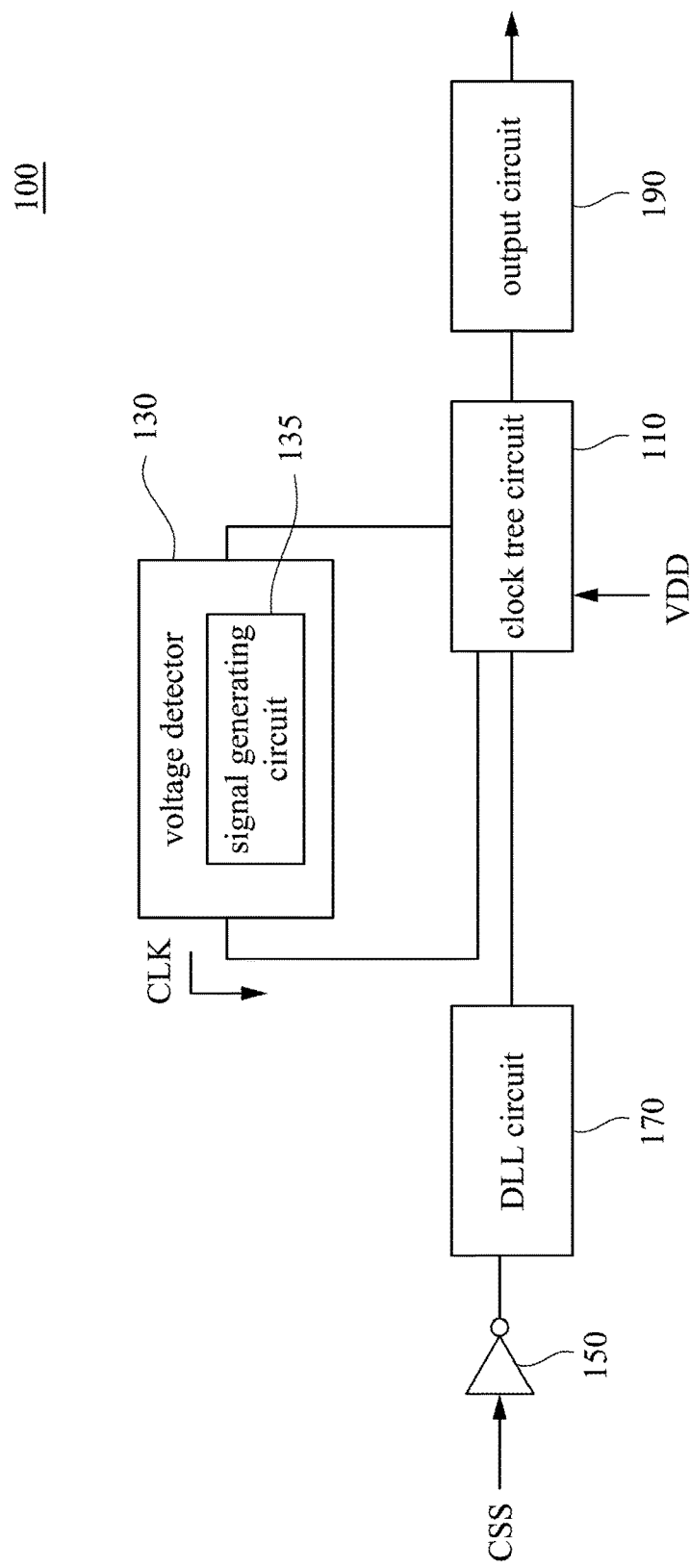
FIG. 1 is a schematic diagram of a clock signal generating circuit according to some embodiments of the present disclosure.

Reference is made to FIG. 1. FIG. 1 is a schematic diagram of a clock signal generating circuit 100 according to some embodiments of the present disclosure. The clock signal generating circuit 100 includes a clock tree circuit 110 and a voltage detector 130. In some embodiments, the voltage detector 130 is coupled to the clock tree circuit 110.

In the operation relationship, the voltage detector 130 is configured to detect a voltage of the clock tree circuit 110 and to transmit a clock signal CLK to the clock tree circuit 110. The voltage detector 130 adjusts a frequency of the clock signal CLK according to the voltage so as to maintain the voltage within a voltage range.

In some embodiments, the voltage detected by the voltage detector 130 is an operating voltage VDD of the clock tree circuit 110. In some embodiments, the voltage detector 130 is further configured to increase the frequency of the clock signal CLK when the detected voltage is higher than a voltage upper threshold, and is configured to decrease the frequency of the clock signal CLK when the voltage is lower than a voltage lower threshold.

Figure 2:
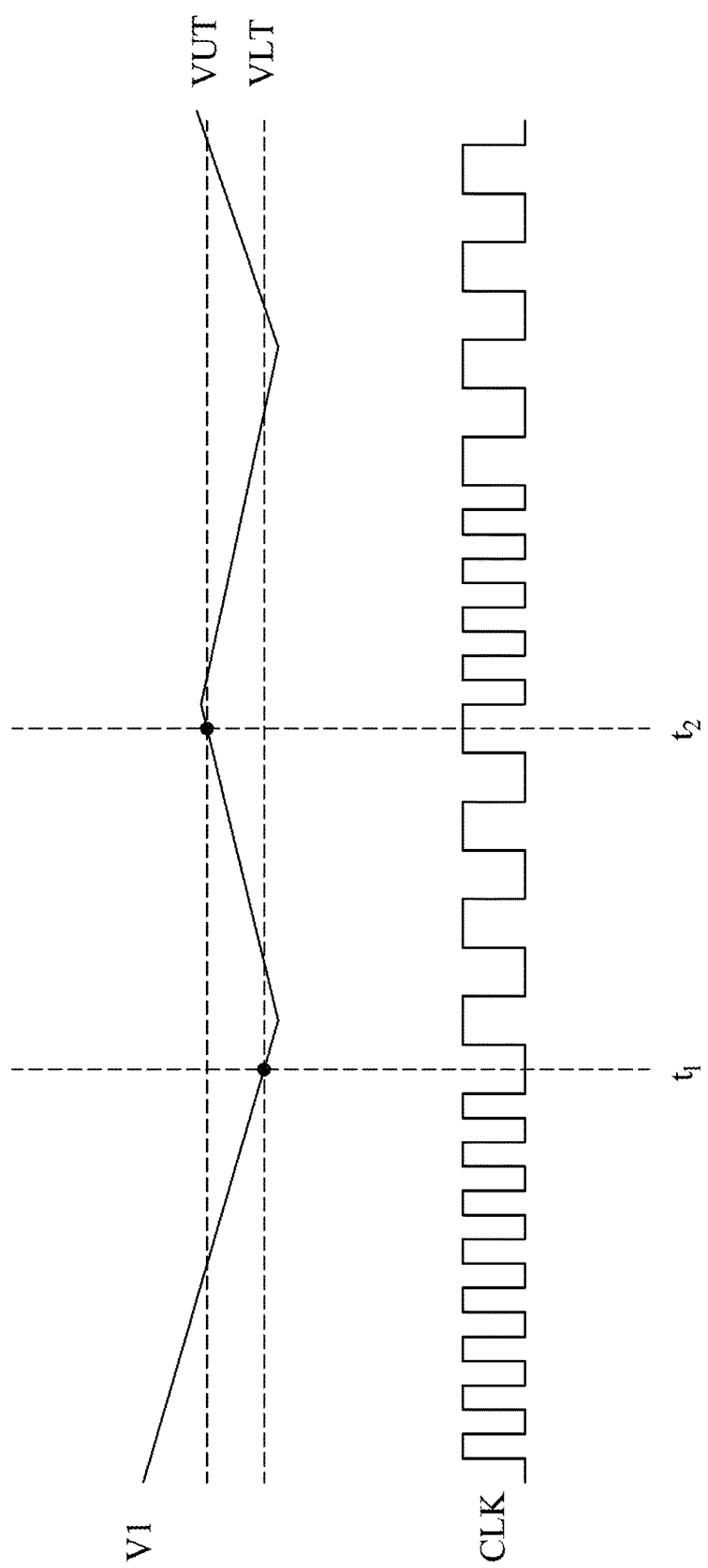
FIG. 2 is an experimental chart according to some embodiments of the present disclosure.

Reference is made to FIG. 2. FIG. 2 is an experimental chart 200 according to some embodiments of the present disclosure. Curve V1 represents the voltage detected by the voltage detector 130. Curve CLK represents the clock signal output by the voltage detector 130. In some embodiments, the curve V1 may represent the operating voltage VDD of the clock tree circuit 110 as illustrated in FIG. 1.

As illustrated in FIG. 2, since at time point t1, the voltage V1 is lower than the voltage lower threshold VLT, the voltage detector 130 decreases the frequency of the clock signal CLK. When the frequency of the clock signal CLK is decreased, the current that flows through the clock tree circuit 110 is decreased, and the energy consumption of the clock tree circuit 110 is decreased. After the energy consumption of the clock tree circuit 110 is decreased, the voltage VDD (as illustrated in FIG. 1) is increased, and the voltage V1 detected by the voltage detector 130 is increased.

On the other hand, since at time point t2, the voltage V1 is higher than the voltage upper threshold VUT, the voltage detector 130 increases the frequency of the clock signal CLK. When the frequency of the clock signal CLK is increased, the current that flows through the clock tree circuit 110 is increased, and the energy consumption of the clock tree circuit 110 is increased. After the energy consumption of the clock tree circuit 110 is increased, the voltage VDD (as illustrated in FIG. 1) is decreased, and the voltage V1 detected by the voltage detector 130 is decreased.

Therefore, the embodiments of the present disclosure may maintain the voltage VDD within a voltage range, that is, the voltage VDD may be maintained between the voltage upper threshold VUT and the voltage lower threshold VLT.

In some embodiments, the voltage upper threshold VUT is 2V, and the voltage lower threshold VLT is 1V. In some embodiments, the frequency of the clock signal CLK is between 800 MHz and 3200 MHz. The value of the voltage upper threshold VUT, the voltage lower threshold VLT, and the frequency of the clock signal CLK are for illustrative purposes only, and the present disclosure is not limited thereto.

Reference is made to FIG. 1 again. In some embodiments, the voltage detector 130 comprises a signal generating circuit 135. The signal generating circuit 135 is configured to generate the clock signal CLK.

In some embodiments, the clock signal generating circuit 100 further comprises a receiver 150, a DLL (delay-locked loop) circuit 170, and an output circuit 190. The receiver 150 is coupled to the DLL circuit 170, the DLL circuit 170 is coupled to the clock tree circuit 110, and the clock tree circuit 110 is coupled to the output circuit 190.

In the operation relationship, the receiver 150 receives a clock source signal CSS and transmits a receiver signal to the DLL circuit 170 according to the clock source signal CSS. The DLL circuit 170 receives the receiver signal and transmits a DLL signal to the clock tree circuit 110 according to the receiver signal. The clock tree circuit 110 receives the DLL signal and the clock signal CLK, and the clock tree circuit 110 transmits a clock tree signal to the output circuit 190. The output circuit 190 sends out an output clock signal according to the clock tree signal.

It should be noted that the clock signal generating circuit 100 may be included in a memory device such as a DDR (double data rate) SDRAM (synchronous dynamic random-access memory), a DDR2 SDRAM, a DDR3 SDRAM, a DDR4 SDRAM, or any other devices that includes a clock signal generating circuit.

Figure 3:
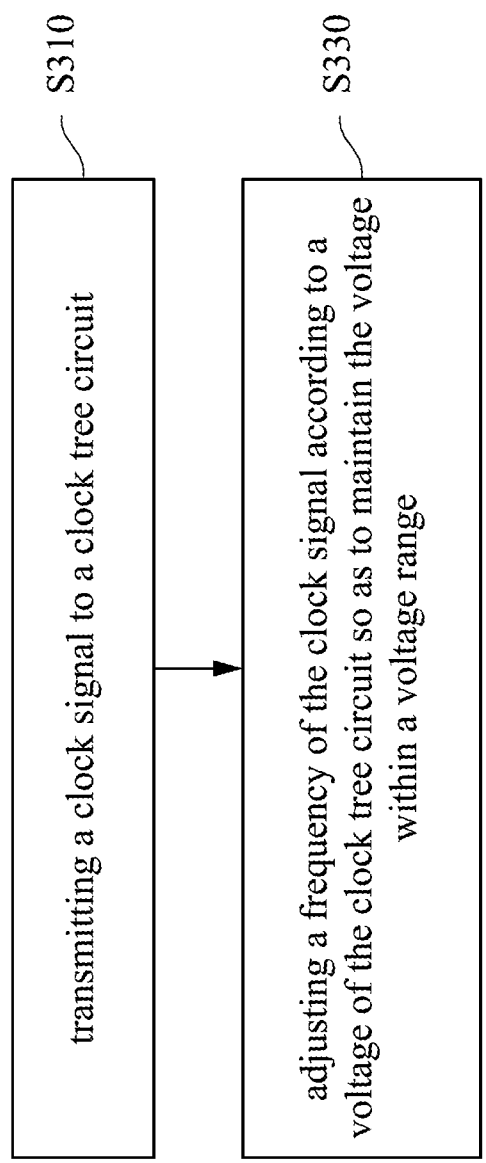
FIG. 3 is an operating method of a clock signal generating circuit according to some embodiments of the present disclosure.

Reference is made to FIG. 3. FIG. 3 is an operating method 300 of a clock signal generating circuit 100 according to some embodiments of the present disclosure. The operating method 300 includes the following operations:

S310: transmitting a clock signal to a clock tree circuit; and

S330: adjusting a frequency of the clock signal according to a voltage of the clock tree circuit so as to maintain the voltage within a voltage range.

For convenience of explanation and understanding, reference is made to FIG. 1 and FIG. 3. These operations are given for illustrative purposes. Additional operations are within the contemplated scoped of the present disclosure.

In operation S310, transmitting a clock signal to a clock tree circuit. In some embodiments, the operation S310 may be performed by the voltage detector 130. For example, the voltage detector 130 detects the operating voltage VDD of the clock tree circuit 110 in FIG. 1, and the voltage detector 130 transmits a clock signal CLK to the clock tree circuit 110 according to the detected voltage.

In operation S330, adjusting a frequency of the clock signal according to a voltage of the clock tree circuit so as to maintain the voltage within a voltage range. In some embodiments, the operation S330 may be performed by the voltage detector 130. For example, the voltage detector 130 increases the frequency of the clock signal CLK when the detected voltage is higher than a voltage upper threshold, and the voltage detector 130 decreases the frequency of the clock signal CLK when the voltage is lower than a voltage lower threshold.

Reference is made to FIG. 2 and FIG. 3 at the same time. Since at time point t1, the voltage V1 is lower than the voltage lower threshold VLT, the voltage detector 130 decreases the frequency of the clock signal CLK. When the frequency of the clock signal CLK is decreased, the current that flows through the clock tree circuit 110 is decreased, and the energy consumption of the clock tree circuit 110 is decreased. After the energy consumption of the clock tree circuit 110 is decreased, the voltage VDD (as illustrated in FIG. 1) is increased, and the voltage V1 detected by the voltage detector 130 is increased.

On the other hand, since at time point t2, the voltage V1 is higher than the voltage upper threshold VUT, the voltage detector 130 increases the frequency of the clock signal CLK. When the frequency of the clock signal CLK is increased, the current that flows through the clock tree circuit 110 is increased, and the energy consumption of the clock tree circuit 110 is increased. After the energy consumption of the clock tree circuit 110 is increased, the voltage VDD (as illustrated in FIG. 1) is decreased, and the voltage V1 detected by the voltage detector 130 is decreased.

As a result, the embodiments of the present disclosure may maintain the voltage VDD within a voltage range, that is, the voltage VDD may be maintained between the voltage upper threshold VUT and the voltage lower threshold VLT. Furthermore, since the operating voltage VDD of the clock tree circuit 110 is stabled, the data output time (tAC) of the clock signal generating circuit 100 would become stable.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An operating method of a clock signal generating circuit, comprising:
    transmitting a clock signal to a clock tree circuit by a voltage detector; and
    adjusting a frequency of the clock signal according to a voltage of the clock tree circuit so as to maintain the voltage within a voltage range.

2. The operating method of claim 1, further comprising:
    increasing the frequency of the clock signal when the voltage is higher than a voltage upper threshold; and
    decreasing the frequency of the clock signal when the voltage is lower than a voltage lower threshold.

3. The operating method of claim 1, wherein the voltage is an operating voltage of the clock tree circuit.

4. The operating method of claim 1, further comprising: generating the clock signal by a signal generating circuit.

5. The operating method of claim 1, further comprising: detecting the voltage of the clock tree circuit by the voltage detector.

6. A clock signal generating circuit, comprising:
a clock tree circuit; and
a voltage detector, coupled to the clock tree circuit, wherein the voltage detector is configured to transmit a clock signal to the clock tree circuit;
wherein the voltage detector adjusts a frequency of the clock signal according to a voltage of the clock tree circuit so as to maintain the voltage within a voltage range.

7. The clock signal generating circuit of claim 6, wherein the voltage detector is further configured to increase the frequency of the clock signal when the voltage is higher than a voltage upper threshold, and the voltage detector is configured to decrease the frequency of the clock signal when the voltage is lower than a voltage lower threshold.

8. The clock signal generating circuit of claim 6, wherein the voltage is an operating voltage of the clock tree circuit.

9. The clock signal generating circuit of claim 6, wherein the voltage detector comprises:
a signal generating circuit, configured to generate the clock signal.

10. The clock signal generating circuit of claim 6, wherein the voltage detector is further configured to detect the voltage of the clock tree circuit.

* * * * *